(12) United States Patent
Tomekawa et al.

(10) Patent No.: US 12,376,393 B2
(45) Date of Patent: Jul. 29, 2025

(54) IMAGE SENSOR INCLUDING CONTROL ELECTRODE, TRANSPARENT ELECTRODE, AND CONNECTION LAYER ELECTRICALLY CONNECTING CONTROL ELECTRODE TO SIDE SURFACE OF TRANSPARENT ELECTRODE

(71) Applicant: Panasonic Intellectual Property Management Co., Ltd., Osaka (JP)

(72) Inventors: Yuuko Tomekawa, Osaka (JP); Katsuya Nozawa, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/598,856

(22) Filed: Mar. 7, 2024

(65) Prior Publication Data

US 2024/0213279 A1 Jun. 27, 2024

Related U.S. Application Data

(63) Continuation of application No. 17/095,691, filed on Nov. 11, 2020, now Pat. No. 11,955,493, which is a (Continued)

(30) Foreign Application Priority Data

Jun. 14, 2018 (JP) .................................. 2018-113447

(51) Int. Cl.
*H01L 27/146* (2006.01)
*H10F 39/00* (2025.01)
*H10K 39/32* (2023.01)

(52) U.S. Cl.
CPC ....... *H10F 39/8023* (2025.01); *H10F 39/811* (2025.01); *H10K 39/32* (2023.02)

(58) Field of Classification Search
CPC ........ H01L 27/14605; H01L 27/14636; H10K 39/32; H10F 39/8023; H10F 39/811
See application file for complete search history.

(56) References Cited

U.S. PATENT DOCUMENTS 6,455,836 B1   9/2002  Hula
2006/0118795 A1  6/2006  Araki
(Continued)

FOREIGN PATENT DOCUMENTS

JP   3-257876 A   11/1991
JP   2002-033471 A   1/2002
(Continued)

OTHER PUBLICATIONS

International Search Report of PCT application No. PCT/JP2019/020662 dated Aug. 13, 2019.
(Continued)

*Primary Examiner* — Peniel M Gumedzoe
(74) *Attorney, Agent, or Firm* — Rimon P.C.

(57) ABSTRACT

An image sensor includes pixel electrodes, a control electrode, a photoelectric conversion film arranged on the pixel electrodes, a transparent electrode arranged on the photoelectric conversion film, an insulating layer arranged on at least a portion of a top surface of the transparent electrode, and a connection layer that electrically connects the control electrode to the transparent electrode. The connection layer is in contact with at least one side surface of the transparent electrode. A side surface of the insulating layer, the at least one side surface of the transparent electrode, and a side surface of the photoelectric conversion film are aligned with each other.

12 Claims, 11 Drawing Sheets

Related U.S. Application Data continuation of application No. PCT/JP2019/020662, filed on May 24, 2019.

(56) References Cited

U.S. PATENT DOCUMENTS

| | | | |
|---|---|---|---|
| 2014/0001454 A1 | 1/2014 | Miyanami et al. | |
| 2014/0353651 A1* | 12/2014 | Takimoto | H01L 27/1464 |
| | | | 257/40 |
| 2015/0001503 A1 | 1/2015 | Hirose | |
| 2015/0070556 A1 | 3/2015 | Joei et al. | |
| 2015/0188065 A1 | 7/2015 | Takimoto | |
| 2016/0072088 A1 | 3/2016 | Hirose | |
| 2017/0012229 A1 | 1/2017 | Hirose | |
| 2017/0328776 A1 | 11/2017 | Shimasaki et al. | |
| 2018/0323391 A1 | 11/2018 | Hirose | |
| 2020/0144525 A1 | 5/2020 | Hirose | |

FOREIGN PATENT DOCUMENTS

| | | |
|---|---|---|
| JP | 2006-049874 A | 2/2006 |
| JP | 2013-135123 A | 7/2013 |
| JP | 2014-011392 A | 1/2014 |
| JP | 2014-060315 A | 4/2014 |
| JP | 2015-012239 A | 1/2015 |
| JP | 2015-056554 A | 3/2015 |
| WO | 2017/081847 A1 | 5/2017 |

OTHER PUBLICATIONS

Non-Final Office Action dated Aug. 17, 2023 issued in U.S. Appl. No. 17/095,691.

Notice of Allowance dated Dec. 11, 2023 issued in U.S. Appl. No. 17/095,691.

* cited by examiner

IMAGE SENSOR INCLUDING CONTROL ELECTRODE, TRANSPARENT ELECTRODE, AND CONNECTION LAYER ELECTRICALLY CONNECTING CONTROL ELECTRODE TO SIDE SURFACE OF TRANSPARENT ELECTRODE

CROSS-REFERENCE TO RELATED APPLICATIONS

This application is a Continuation of U.S. patent application Ser. No. 17/095,691, filed on Nov. 11, 2020, which is a Continuation of International Patent Application No. PCT/JP2019/020662, filed on May 24, 2019, which claims priority to Japanese Patent Application No. 2018-113447, filed on Jun. 14, 2018, the entire disclosures each of which are hereby incorporated by reference.

BACKGROUND

1. Technical Field

The present disclosure relates to an image sensor and a fabrication method therefor.

2. Description of the Related Art

An image sensor includes a photo-detecting element that generates an electrical signal in relation to the amount of incident light and includes a plurality of pixels arranged in one dimension or two dimensions. A multilayer image sensor refers to, among image sensors, an image sensor having, as a pixel, a photo-detecting element having a structure in which a pixel electrode, a photoelectric conversion film, and a transparent electrode are stacked in order from the substrate side.

The photo-detecting element of the multilayer image sensor is connected to a signal detection circuit via the pixel electrode and connected to a voltage control element via the transparent electrode. The signal detection circuit detects an electrical signal generated by incident light on the photo-detecting element.

The voltage control element performs control such that the voltage of the transparent electrode falls within a specified range so that the signal detection circuit can properly detect the electrical signal generated in the photo-detecting element. In a case where an electric current flows from the pixel electrode, the voltage control element causes an electric current as much as the electric current to flow through the transparent electrode, so that the photo-detecting element is prevented from being charged.

Japanese Unexamined Patent Application Publication No. 2014-60315 and U.S. Pat. No. 9,224,789 disclose an image sensor including a photoelectric conversion film formed of an organic semiconductor, a transparent electrode formed on the organic photoelectric conversion film, a protective film formed on the transparent electrode, and a wiring line that electrically connects the transparent electrode exposed in an opening provided in the protective film to the voltage control element.

SUMMARY

In one general aspect, the techniques disclosed here feature an exemplary image sensor according to the present disclosure including pixel electrodes, a control electrode, a photoelectric conversion film arranged on the pixel electrodes, a transparent electrode arranged on the photoelectric conversion film, an insulating layer arranged on at least a portion of a top surface of the transparent electrode, and a connection layer that electrically connects the control electrode to the transparent electrode. The connection layer is in contact with at least one side surface of the transparent electrode. A side surface of the insulating layer, the at least one side surface of the transparent electrode, and a side surface of the photoelectric conversion film are aligned with each other.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
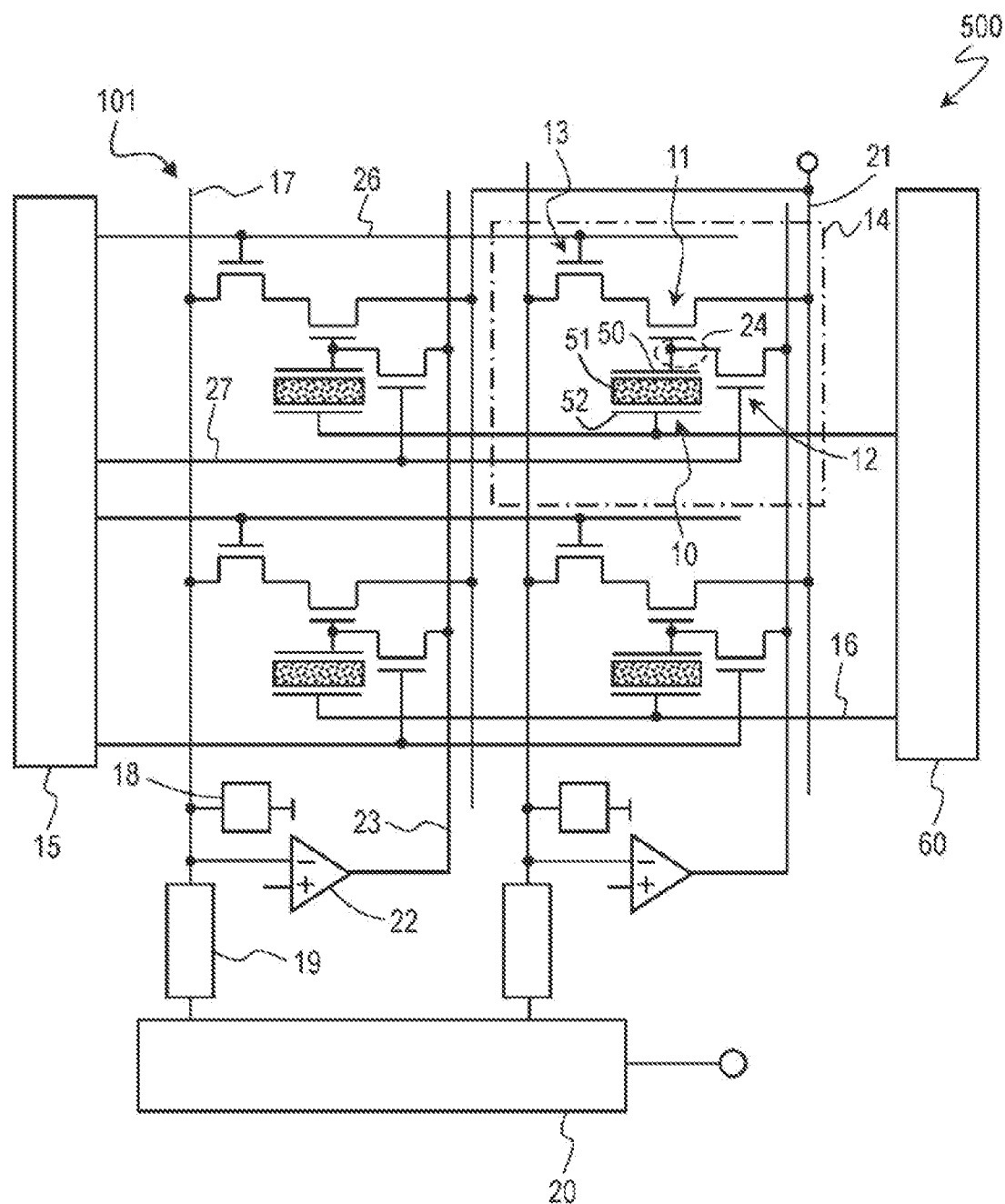
FIG. 1 is a schematic diagram illustrating a circuit configuration of an imaging device.

In a multilayer image sensor, the sensitivity of a photoelectric conversion film formed of a certain kind of material greatly changes depending on the voltage applied to the transparent electrode, and the sensitivity can be made virtually zero. By using this characteristic, a multilayer image sensor capable of performing electronic shutter operation can be realized by changing the voltage of the transparent electrode.

Furthermore, for another photoelectric conversion film, the optical spectrum, which is a spectral sensitivity characteristic, of the photoelectric conversion film can be greatly changed depending on the voltage applied to the transparent electrode. By using this characteristic, in a multilayer image sensor of a certain type, the spectral sensitivity characteristic of the photoelectric conversion film can be changed among two or more different spectral sensitivity characteristics by changing the voltage of the transparent electrode.

For these image sensors, a voltage control element realizes a function for operating an electronic shutter or a function for changing the spectral sensitivity characteristic by temporally changing the voltage applied to the transparent electrode.

In this manner, in a multilayer image sensor, in order that the signal detection circuit properly detects an electrical signal generated in the photo-detecting element, the voltage control element needs to perform control such that the voltage of the transparent electrode falls within a specified range. In addition, in a case where an electric current flows from a pixel electrode, an electric current needs to flow between the voltage control element and the transparent electrode so that the photo-detecting element is prevented from being charged.

For these types of control or operation, the lower the resistance of a voltage application path including the transparent electrode between the voltage control element and the photoelectric conversion film, the smaller the voltage change and power consumption, and the higher the speed of temporal change, which are examples of advantages.

In contrast, some materials used in the photoelectric conversion film react with, for example, oxygen, ozone, or moisture, so that the photoelectric conversion function deteriorates. For example, in a case where the photoelectric conversion film is formed of an organic semiconductor, the organic semiconductor contains a material that tends to react with, for example, oxygen, ozone, or moisture. Thus, during the fabrication process of an image sensor, preferably, the photoelectric conversion film is formed and patterned in an environment in which the photoelectric conversion function does not deteriorate. For example, preferably, the photoelectric conversion film is formed and patterned under an inert atmosphere of, for example, nitrogen or a vacuum.

However, generally, a significantly large-scale fabrication apparatus is needed to perform the entirety of the formation and patterning of the photoelectric conversion film under an inert atmosphere or a vacuum. In addition, also in a case where a wafer on which the photoelectric conversion film is formed is conveyed between fabrication apparatuses, large-scale conveying equipment is needed to perform such conveyance under an inert atmosphere.

The inventors of the present disclosure conceived image sensors having novel structures in which a voltage control element is connected to a photoelectric conversion film with low resistance and with which the photoelectric conversion film can be easily handled during the fabrication process. The summary of image sensors and image sensor fabrication methods of the present disclosure is as follows.

[Item 1]

An image sensor according to Item 1 of the present disclosure includes
pixel electrodes,
a control electrode,
a photoelectric conversion film arranged on the pixel electrodes,
a transparent electrode arranged on the photoelectric conversion film,
an insulating layer arranged on at least a portion of a top surface of the transparent electrode, and
a connection layer that electrically connects the control electrode to the transparent electrode.
The connection layer is in contact with at least one side surface of the transparent electrode, and
a side surface of the insulating layer, the at least one side surface of the transparent electrode, and a side surface of the photoelectric conversion film are aligned with each other.

In this case, the transparent electrode may be formed of a conductive semiconductor. The control electrode may be formed of a metal or a metallic compound.

[Item 2]

In the image sensor described in Item 1, the connection layer may also be in contact with the side surface of the photoelectric conversion film.

[Item 3]

In the image sensor described in Item 1 or 2, the connection layer may cover a portion of the insulating layer.

[Item 4]

In the image sensor described in any one of Items 1 to 3, the connection layer does not have to be in contact with the top surface of the transparent electrode.

[Item 5]

In the image sensor described in any one of Items 1 to 4, in plan view, the connection layer may partially overlap with the pixel electrodes.

[Item 6]

In the image sensor described in any one of Items 1 to 5, the connection layer may have a light-blocking property.

[Item 7]

The image sensor described in any one of Items 1 to 6 may further include a protective film that covers the connection layer and the insulating layer.

[Item 8]

In the image sensor described in any one of Items 1 to 7,
in plan view, the transparent electrode may have a polygonal shape, the at least one side surface of the transparent electrode may include a plurality of side surfaces, and
the connection layer may be in contact with the plurality of side surfaces of the transparent electrode.

[Item 9]

In the image sensor described in any one of Items 1 to 8, a hole through which the top surface of the transparent electrode is connected to the connection layer does not have to be arranged in the insulating layer.

[Item 10]

In the image sensor described in any one of Items 1 to 9, in plan view, the connection layer may overlap with at least a portion of the insulating layer, at least a portion of the transparent electrode, and at least a portion of the photoelectric conversion film.

[Item 11]

A method for fabricating an image sensor according to Item 11 of the present disclosure includes
preparing a substrate on which pixel electrodes and a control electrode are provided, forming a photoelectric conversion film on the pixel electrodes, forming a transparent electrode on a top surface of the photoelectric conversion film, forming an insulating layer on the transparent electrode, patterning the photoelectric conversion film, the transparent electrode, and the insulating layer so that a side surface of the insulating layer, a side surface of the transparent electrode, and a side surface of the photoelectric conversion film are aligned with each other, and forming a connection layer that electrically connects the side surface of the transparent electrode, which is exposed by the patterning, to the control electrode.

[Item 12]

In the method described in Item 11, in the patterning, a hole through which a top surface of the transparent electrode is connected to the connection layer does not have to be formed in the insulating layer.

[Item 13]

In the method described in Item 11 or 12, in the forming of the connection layer, the connection layer may be brought into contact with the photoelectric conversion film.

[Item 14]

In the method described in any one of Items 11 to 13, in the patterning, the insulating layer may be patterned so as to expose an outer periphery of a top surface of the transparent electrode, and in the forming of the connection layer, the connection layer may be brought into contact with the outer periphery of the transparent electrode.

[Item 15]

In the method described in any one of Items 11 to 14, in the forming of the connection layer, the connection layer may be formed on at least a portion of the insulating layer.

[Item 16]

An image sensor fabrication method according to Item 16 of the present disclosure includes a step (A) for preparing a circuit portion that has a plurality of pixel electrodes and a control electrode, a step (B) for forming a photoelectric conversion film on the plurality of pixel electrodes, a step (C) for forming a transparent electrode formed of a conductive semiconductor on a top surface of the photoelectric conversion film, a step (D) for forming an insulating layer on the transparent electrode, a step (E) for performing patterning by removing each of a portion of the photoelectric conversion film, a portion of the transparent electrode, and a portion of the insulating layer, and a step (F) for forming a connection layer that electrically connects a side surface of the transparent electrode exposed by performing the step (E) to the control electrode.

[Item 17]

In the image sensor fabrication method described in Item 16, in the step (F), the connection layer may also be joined to the photoelectric conversion film.

[Item 18]

In the image sensor fabrication method described in Item 16, in the step (E), the portion of the transparent electrode and the portion of the insulating layer may be removed by dry etching using a gas containing at least one of chlorine and fluorine, and the portion of the photoelectric conversion film may be removed by dry etching using a gas containing oxygen.

[Item 19]

In the image sensor fabrication method described in any one of Items 16 to 18, in the step (E), the insulating layer may be patterned so as to expose an outer peripheral portion of the top surface of the transparent electrode, and in the step (F), the connection layer may also be joined to the outer peripheral portion of the transparent electrode.

[Item 20]

In the image sensor fabrication method described in any one of Items 16 to 18, in the step (F), the connection layer may be formed on at least a portion of the insulating layer.

Hereinafter, embodiments of image sensors of the present disclosure will be described with reference to the drawings.

Overview of Imaging Device including Image Sensor

First, an imaging device that uses an image sensor of the present disclosure will be described in general terms. FIG. 1 schematically illustrates a circuit configuration of an imaging device 500. The imaging device 500 includes an image sensor 101 including a plurality of unit pixel cells 14 and a peripheral circuit.

The plurality of unit pixel cells 14 are arranged on a semiconductor substrate two-dimensionally, that is, in a row direction and a column direction to form a pixel region. The image sensor 101 may be a line sensor. In that case, the plurality of unit pixel cells 14 may be arranged in one dimension. Herein, the row direction and the column direction refer to the direction in which rows extend and the direction in which columns extend, respectively. That is, the vertical direction is the column direction, and the horizontal direction is the row direction.

Each unit pixel cell 14 includes a photodetector 10, an amplification transistor 11, a reset transistor 12, and an address transistor 13, which is a row selection transistor. The photodetector 10 includes a pixel electrode 50 and a transparent electrode 52. The image sensor 101 includes a voltage control element for applying a predetermined voltage to the transparent electrode 52. The voltage control element is, for example, a voltage control circuit, a voltage generation circuit such as a constant voltage source, or a voltage reference line such as a ground wire. The voltage applied by the voltage control element is called a control voltage. In the present embodiment, a voltage control circuit 60 is provided as the voltage control element. The voltage control circuit 60 may generate a constant control voltage or a plurality of control voltages having different values from each other. For example, two or more control voltages having different values from each other may be generated, or the control voltage that continuously changes in a predetermined range may be generated. The voltage control circuit 60 determines the value of a control voltage to be generated, on the basis of a command from an operator who operates the imaging device 500 and a command from, for example, another control unit included in the imaging device 500 and generates a control voltage whose value has been determined. The voltage control circuit 60 is provided, as a portion of the peripheral circuit, outside a photosensitive area. That is, the voltage control circuit 60 may be included in the image sensor 101.

For example, the voltage control circuit 60 generates two or more different control voltages, and the spectral sensitivity characteristic of a photoelectric conversion film 51 is changed by applying the control voltages to the transparent electrode 52. In addition, the variations in the spectral sensitivity characteristic include a spectral sensitivity characteristic in which the sensitivity of the photoelectric conversion film 51 becomes zero with respect to light to be detected. Thus, for example, while the unit pixel cell 14 is reading out a detection signal on a row-by-row basis in the imaging device 500, the effect of incident light when the detection signal is read out can be made virtually zero by applying, from the voltage control circuit 60 to the transparent electrode 52, the control voltage with which the sensitivity of the photoelectric conversion film 51 becomes zero. Therefore, it is possible to realize a global shutter operation even in a case where the detection signal is substantially read out on a row-by-row basis.

In the present embodiment, by applying the control voltage to the transparent electrodes 52 of the unit pixel cells 14 arranged in the row direction via a counter electrode signal line 16 as illustrated in FIG. 1, the voltage between the pixel electrode 50 and the transparent electrode 52 of each unit pixel cell 14 is changed, thereby switching between the spectral sensitivity characteristics in the photodetector 10. Alternatively, an electronic shutter operation is realized by applying the control voltage at a predetermined timing during imaging so that a spectral sensitivity characteristic in which the sensitivity to light becomes zero is obtained. The control voltage may be applied to the pixel electrode 50. In order to irradiate the photodetector 10 with light and store holes at the pixel electrode 50 as a signal charge, the pixel electrode is set to a relatively low potential with respect to the transparent electrode 52. In this case, an electric current flows from the pixel electrode 50 to the transparent electrode 52 since the direction in which electrons move is opposite. In addition, in order to irradiate the photodetector 10 with light and accumulate holes at the pixel electrode 50 as a signal charge, the pixel electrode is set to a relatively low potential with respect to the transparent electrode 52. In this case, an electric current flows from the pixel electrode 52 to the transparent electrode 50.

The pixel electrode 50 is connected to the gate electrode of the amplification transistor 11, and the signal charge collected by the pixel electrode 50 is stored in a charge storage node 24, which is positioned between the pixel electrode 50 and the gate electrode of the amplification transistor 11. In the present embodiment, the signal charge is holes; however, the signal charge may be electrons.

The signal charge stored in the charge storage node 24 is applied to the gate electrode of the amplification transistor 11 as a voltage in relation to the amount of signal charge. The amplification transistor 11 is included in a signal detection circuit and amplifies the voltage applied to the gate electrode. The address transistor 13 selectively reads out the amplified voltage as a signal voltage. The source-drain electrode of the reset transistor 12 is connected to the pixel electrode 50 and resets the signal charge stored in the charge storage node 24. In other words, the reset transistor 12 resets the potential of the gate electrode of the amplification transistor 11 and that of the pixel electrode 50.

In order to perform the above-described operation for the plurality of unit pixel cells 14 in a selective manner, the imaging device 500 includes power wiring lines 21, vertical signal lines 17, address signal lines 26, and reset signal lines 27, and these lines are connected to corresponding unit pixel cells 14. Specifically, for each unit pixel cell 14, the power wiring line 21 is connected to the source-drain electrode of the amplification transistor 11, and the vertical signal line 17 is connected to the source-drain electrode of the address transistor 13. The address signal line 26 is connected to the gate electrode of the address transistor 13. The reset signal line 27 is connected to the gate electrode of the reset transistor 12.

The peripheral circuit includes a vertical scanning circuit 15, a horizontal signal readout circuit 20, a plurality of column signal processing circuits 19, a plurality of load circuits 18, and a plurality of differential amplifiers 22. The vertical scanning circuit 15 is also called a row scanning circuit. The horizontal signal readout circuit 20 is also called a column scanning circuit. The column signal processing circuits 19 are also called row signal storage circuits. The differential amplifiers 22 are also called feedback amplifiers.

The vertical scanning circuit 15 is connected to the address signal lines 26 and the reset signal lines 27 and selects, on a row-by-row basis, a row of unit pixel cells 14 from among the plurality of unit pixel cells 14 arranged in individual rows to read out signal voltages and reset the potential of the pixel electrodes 50. The power wiring lines 21, which are a source follower power supply, supply a predetermined power supply voltage to each unit pixel cell 14. The horizontal signal readout circuit 20 is electrically connected to the plurality of column signal processing circuits 19. Each column signal processing circuit 19 is electrically connected to the unit pixel cells 14 arranged in a corresponding one of the columns via the vertical signal line 17 corresponding to the column. The load circuits 18 are electrically connected to the respective vertical signal lines 17. Each amplification transistor 11 and its corresponding load circuit 18 form a source follower circuit.

The plurality of differential amplifiers 22 are provided so as to correspond to the respective columns. The negative input terminal of each differential amplifier 22 is connected to the corresponding vertical signal line 17. Moreover, the output terminal of the differential amplifier 22 is connected to the unit pixel cells 14 via a feedback line 23 corresponding to the column.

The vertical scanning circuit 15 applies a row selection signal for controlling ON-OFF of the address transistors 13 to the gate electrodes of the address transistors 13 through an address signal line 26. Consequently, the row to be read is scanned and selected. The signal voltages are read out from the unit pixel cells 14 of the selected row to the vertical signal lines 17. Moreover, the vertical scanning circuit 15 applies a reset signal for controlling ON-OFF of the reset transistors 12 to the gate electrodes of the reset transistors 12 through the reset signal line 27. Consequently, the row of unit pixel cells 14 to be reset is selected. The vertical signal lines 17 transmit the signal voltages read out from the unit pixel cells 14 selected by the vertical scanning circuit 15 to the column signal processing circuits 19.

The column signal processing circuits 19 perform noise suppression signal processing, notably correlated double sampling, and analog-to-digital conversion (AD conversion).

The horizontal signal readout circuit 20 reads out the signals successively from the plurality of column signal processing circuits 19 to a horizontal common signal line (not illustrated).

The differential amplifier 22 is connected to the drain electrodes of the reset transistors 12 via the feedback line 23.

Thus, when one of the address transistors 13 and the reset transistor 12 are in the conductive state, the differential amplifier 22 receives, through the negative terminal, an output value of the address transistor 13. The differential amplifier 22 performs feedback operation so that the gate potential of the amplification transistor 11 becomes a predetermined feedback voltage. In this case, the output voltage value of the differential amplifier 22 is 0 V or a positive voltage near 0 V. The feedback voltage means the output voltage of the differential amplifier 22.

Figure 2:
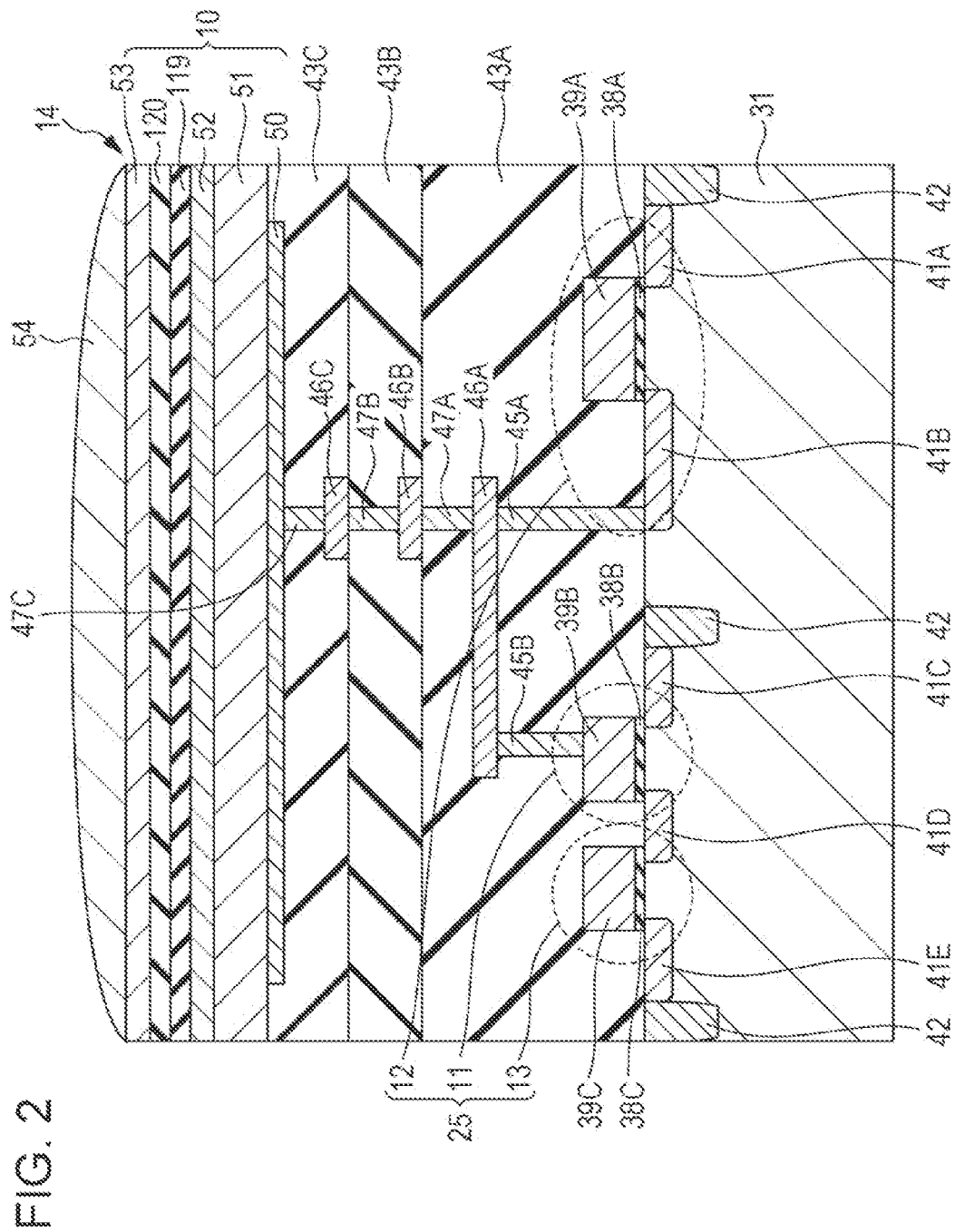
FIG. 2 is a schematic diagram illustrating a cross section of a device structure of a unit pixel cell in the imaging device.

FIG. 2 schematically illustrates a cross section of a device structure of the unit pixel cell 14 in the imaging device 500. The unit pixel cell 14 includes a semiconductor substrate 31, a charge detection circuit 25, and a photodetector 10. The semiconductor substrate 31 is, for example, a p-type silicon substrate. The charge detection circuit 25 detects a signal charge captured by the pixel electrode 50 and outputs a signal voltage. The charge detection circuit 25 includes the amplification transistor 11, the reset transistor 12, and the address transistor 13 and is formed in and on the semiconductor substrate 31.

The amplification transistor 11 includes n-type impurity regions 41C and 41D, a gate insulating layer 38B, and a gate electrode 39B. The n-type impurity regions 41C and 41D are formed in the semiconductor substrate 31 and respectively function as the drain electrode and the source electrode. The gate insulating layer 38B is positioned on the semiconductor substrate 31, and the gate electrode 39B is positioned on the gate insulating layer 38B.

The reset transistor 12 includes n-type impurity regions 41B and 41A, a gate insulating layer 38A, and a gate electrode 39A. The n-type impurity regions 41B and 41A are formed in the semiconductor substrate 31 and respectively function as the drain electrode and the source electrode. The gate insulating layer 38A is positioned on the semiconductor substrate 31, and the gate electrode 39A is positioned on the gate insulating layer 38A.

The address transistor 13 includes n-type impurity regions 41D and 41E, a gate insulating layer 38C, and a gate electrode 39C. The n-type impurity regions 41D and 41E are formed in the semiconductor substrate 31 and respectively function as the drain electrode and the source electrode. The gate insulating layer 38C is positioned on the semiconductor substrate 31, and the gate electrode 39C is positioned on the gate insulating layer 38C. The n-type impurity region 41D is shared by the amplification transistor 11 and the address transistor 13, and thus the amplification transistor 11 and the address transistor 13 are connected in series.

In the semiconductor substrate 31, an element isolation region 42 is provided between the unit pixel cell 14 and an adjacent unit pixel cell 14 and between the amplification transistor 11 and the reset transistor 12. The element isolation region 42 electrically separates the adjacent unit pixel cells 14 from each other. In addition, the leakage of signal charge stored in the charge storage node is suppressed.

Interlayer insulating layers 43A, 43B, and 43C are stacked on the surface of the semiconductor substrate 31. In the interlayer insulating layer 43A, a contact plug 45A, a contact plug 45B, and a wiring line 46A are embedded. The contact plug 45A is connected to the n-type impurity region 41B of the reset transistor 12, the contact plug 45B is connected to the gate electrode 39B of the amplification transistor 11, and the wiring line 46A connects the contact plug 45A to the contact plug 45B. As a result, the n-type impurity region 41B (the drain electrode) of the reset transistor 12 is electrically connected to the gate electrode 39B of the amplification transistor 11. Moreover, the wiring line 46A is electrically connected to the pixel electrode 50 via a contact plug 47A, a wiring line 46B, a contact plug 47B, a wiring line 46C, and a contact plug 47C.

The photodetector 10 is provided in and on the interlayer insulating layer 43C. The photodetector 10 includes the transparent electrode 52, the photoelectric conversion film 51, and the pixel electrode 50, which is positioned closer to the semiconductor substrate 31 than the transparent electrode 52 is. The photoelectric conversion film 51 is sandwiched between the transparent electrode 52 and the pixel electrode 50. The photodetector 10 also includes an insulating layer 119 formed on at least a portion of the top surface of the transparent electrode 52. The photodetector 10 may further include a protective film 120. The structure of the photoelectric conversion film 51 will be described in detail below. The pixel electrode 50 is provided in the interlayer insulating layer 43C.

The transparent electrode 52 is formed of a semiconductor that is transparent to light to be detected and has conductivity. For example, the transparent electrode 52 is formed of indium tin oxide (ITO), aluminum-doped zinc oxide (AZO), or gallium-doped zinc oxide (GZO), or the like. The transparent electrode 52 may also be formed of another transparent conductive semiconductor. The pixel electrode 50 is formed of, for example, a metal such as aluminum or copper, or a polysilicon doped with impurities and having conductivity.

As illustrated in FIG. 2, the unit pixel cell 14 has a color filter 53 above the transparent electrode 52 of the photodetector 10. The unit pixel cell 14 may further include a microlens 54 on the color filter 53.

In the present embodiment, the photoelectric conversion film 51 and the transparent electrode 52 of each unit pixel cell 14 are connected to the photoelectric conversion films 51 and the transparent electrodes 52 of the adjacent unit pixel cells 14, respectively, and the photoelectric conversion films 51 and the transparent electrodes 52 are formed in an integrated manner. Note that the photoelectric conversion films 51 may be separated from each other for each unit pixel cell 14. Moreover, for the transparent electrodes 52 of the two dimensionally arranged unit pixel cells 14, the transparent electrodes 52 may be connected in an integrated manner on a row-by-row basis or a column-by-column basis. In contrast to this, the pixel electrode 50 of each unit pixel cell 14 is not connected to the pixel electrodes 50 of the adjacent unit pixel cells 14 and is independently provided.

Note that the image sensor 101 may detect a change in the capacitance of the photoelectric conversion film without detecting a charge generated by photoelectric conversion. Such type of image sensor and imaging device are disclosed in, for example, International Publication No. WO2017/081847. That is, the photoelectric conversion film 51 may generate electron-hole pairs in relation to the intensity of incident light or the capacitance thereof may change in accordance with the intensity of incident light. It is possible to detect light incident on the photoelectric conversion film 51 by detecting a generated charge or a change in the capacitance.

Configuration of Image Sensor

Figure 3A:
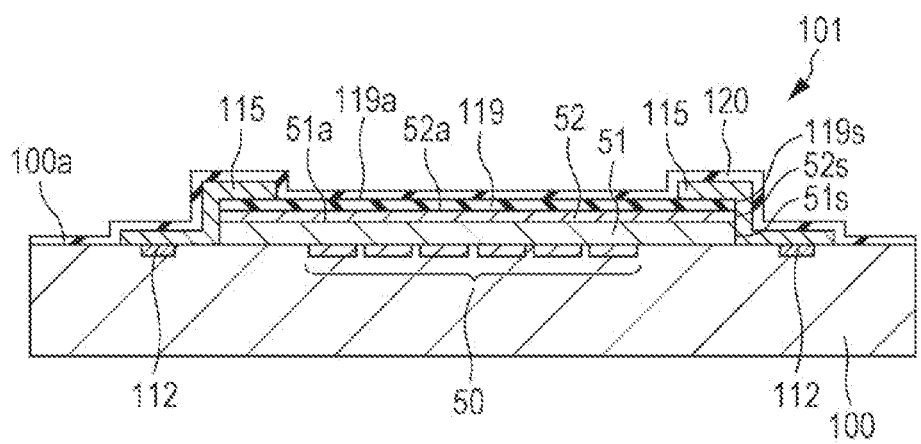
FIG. 3A is a schematic cross section of an image sensor of a present embodiment.
Figure 3B:
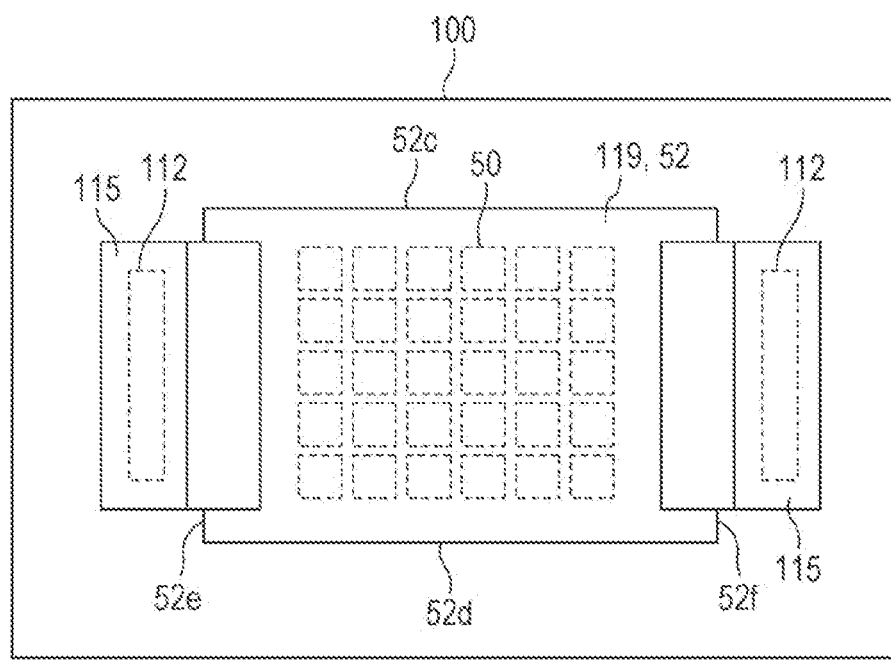
FIG. 3B is a schematic top view of the image sensor of the present embodiment with its protective film removed.

FIG. 3A is a schematic cross section of the image sensor 101, and FIG. 3B is a schematic top view of the image sensor 101 from which the protective film 120 is removed. In the subsequent figures, the semiconductor substrate 31 and the interlayer insulating layers 43A, 43B, and 43C illustrated in FIG. 2 are collectively illustrated as a substrate 100.

The image sensor 101 includes the plurality of pixel electrodes 50, the photoelectric conversion film 51, and the transparent electrode 52, which are described above. The image sensor 101 further includes control electrodes 112 and connectors 115. The plurality of pixel electrodes 50 and the control electrodes 112 form a circuit portion formed in the substrate 100. In addition, the connectors 115 form a portion of the counter electrode signal lines 16.

The plurality of pixel electrodes 50 are arranged one-dimensionally or two-dimensionally and embedded in the substrate 100 so as to leave the top surface of each of the plurality of pixel electrodes 50 exposed from a top surface 100*a* of the substrate 100. The photoelectric conversion film 51 is arranged on the top surface 100*a* of the substrate 100 so as to cover the plurality of pixel electrodes 50. Furthermore, the transparent electrode 52 is arranged on the photoelectric conversion film 51. The transparent electrode 52 covers a top surface 51*a* of the photoelectric conversion film 51 so as to cover at least the region of the photoelectric conversion film 51 where the pixel electrodes 50 are provided. In the present embodiment, the transparent electrode 52 is formed so as to cover the entire top surface 51*a* of the photoelectric conversion film 51.

The insulating layer 119 is formed so as to cover at least a portion of a top surface 52*a* of the transparent electrode 52. The insulating layer 119 may cover the top surface 52*a* so as to cover at least the region of the transparent electrode 52 under which the pixel electrodes 50 are provided.

Each connector 115 is joined to the corresponding control electrode 112 and the transparent electrode 52 and electrically connects these electrodes to each other. Specifically, the connector 115 is joined to the control electrode 112 exposed from the substrate 100 and to a side surface 52*s* of the transparent electrode 52. Furthermore, the connector 115 covers a side surface 51*s* of the photoelectric conversion film 51. In addition, the connector 115 covers a portion of a region of a top surface 119*a* of the insulating layer 119, the region not overlying the region where the pixel electrodes 50 are provided. The area of the junction of the connector 115 and the control electrode 112 may be larger than, smaller than, or the same as the area of the junction of the connector 115 and the transparent electrode 52.

In the present embodiment, in plan view, the photoelectric conversion film 51, the insulating layer 119, and the transparent electrode 52 have a rectangular shape, and among four sides 52*c*, 52*d*, 52*e*, and 52*f* of the transparent electrode 52, the control electrodes 112 are arranged close to the sides 52*e* and 52*f*. Thus, the image sensor 101 includes two connectors 115, and the two connectors 115 are each joined to the corresponding control electrode 112 and the corresponding side surface 52*s* of the transparent electrode 52 at positions close to the sides 52*e* and 52*f* of the transparent electrode 52 and electrically connect the control electrodes 112 to the transparent electrode 52. In the present embodiment, at each of the four sides 52*c*, 52*d*, 52*e*, and 52*f* of the transparent electrode 52, a side surface 119*s* of the insulating layer 119 is flush with the side surface 52*s* of the transparent electrode 52.

The protective film 120 covers the connectors 115 and the insulating layer 119 and is provided on the top surface 100*a* of the substrate 100.

The photoelectric conversion film 51 is formed of, for example, an organic semiconductor. The photoelectric conversion film 51 may include one or more organic semiconductor layers. For example, the photoelectric conversion film 51 may include, for example, a carrier transport layer for transporting electrons or holes, a blocking layer for blocking carriers, and the like in addition to a photoelectric conversion layer for generating electron-hole pairs. For these organic semiconductor layers, an organic p-type semiconductor and an organic n-type semiconductor, which are known materials, can be used.

The transparent electrode 52 is formed of a material among the above-described materials. The control electrode 112 is formed of a metal or a metallic compound and has a light-blocking property. For example, the control electrode 112 is formed of titanium, titanium nitride, aluminum, silicon and copper doped aluminum, copper, tungsten, or the like or an alloy of any of these metals. The control electrode 112 may be formed by a single layer of a material among the above-described materials or may have a multilayer structure including a plurality of layers.

The connector 115 is formed of a metal or a metallic compound. For example, the connector 115 is formed of titanium, titanium nitride, aluminum, silicon, copper-doped aluminum (AlSiCu), copper, tungsten, gold, silver, nickel, cobalt, or the like or an alloy of any of these metals. In addition, similarly to the control electrode 112, the connector 115 may be a single layer or may be multiple layers.

The insulating layer 119 and the protective film 120 are formed of an insulative material. For example, the insulating layer 119 is formed of silicon oxide, silicon nitride, silicon oxynitride, an organic or inorganic polymer material, or the like. The insulating layer 119 and the protective film 120 may be transparent to light having a wavelength to be detected by the image sensor 101.

Image Sensor Fabrication Method

The image sensor 101 can be fabricated by, for example, the following method.

(A) Step for Preparing Circuit Portion

Figure 4A:
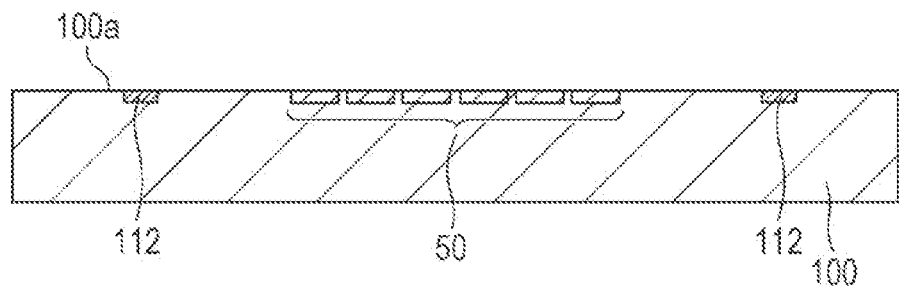
FIG. 4A is a cross section illustrating a step in an image sensor fabrication method of the present embodiment.

First, as illustrated in FIG. 4A, a circuit portion is prepared. Specifically, the substrate 100 is prepared, which has the plurality of pixel electrodes 50 and the control electrodes 112 exposed at the top surface 100*a* as described above. More specifically, in the circuit portion, each pixel electrode 50 has a structure illustrated in FIG. 2, and the circuit portion can be fabricated using a known semiconductor device fabrication method.

(B) Step for Forming Photoelectric Conversion Film

Figure 4B:
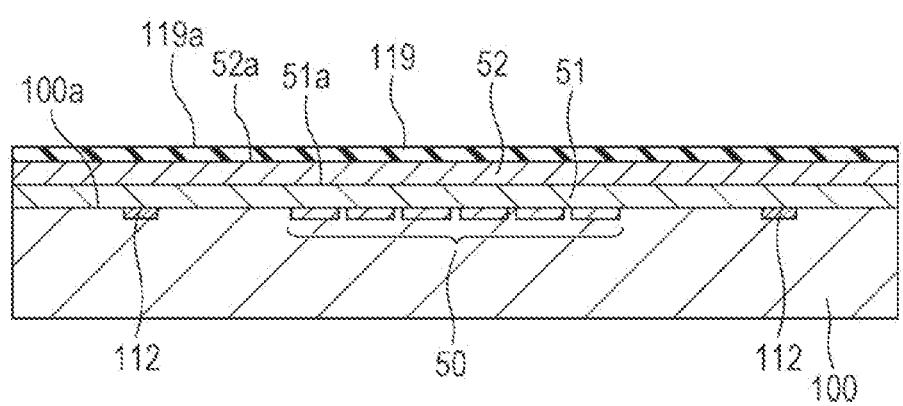
FIG. 4B is a cross section illustrating steps in the image sensor fabrication method of the present embodiment.

As illustrated in FIG. 4B, the photoelectric conversion film 51 is formed on the top surface 100*a* of the substrate 100 so as to cover at least the pixel electrodes 50. The photoelectric conversion film 51 can be formed by, for example, a spin coating method, an inkjet method, a die coating method, a spray coating method, a vacuum deposition method, or a screen printing method.

(C) Step for Forming Transparent Electrode

As illustrated in FIG. 4B, the transparent electrode 52 is formed on the photoelectric conversion film 51. The transparent electrode 52 is formed on at least the region of the photoelectric conversion film 51 where the pixel electrodes 50 are provided. The transparent electrode 52 may be formed by sputtering.

(D) Step for Forming Insulating Layer

As illustrated in FIG. 4B, the insulating layer 119 is formed on the transparent electrode 52. The insulating layer 119 is formed on at least the region of the transparent electrode 52 under which the pixel electrodes 50 are provided. The insulating layer 119 can be formed by, for example, atomic layer deposition (ALD), chemical vapor deposition (CVD), or sputtering.

(E) Patterning Step

Figure 4C:
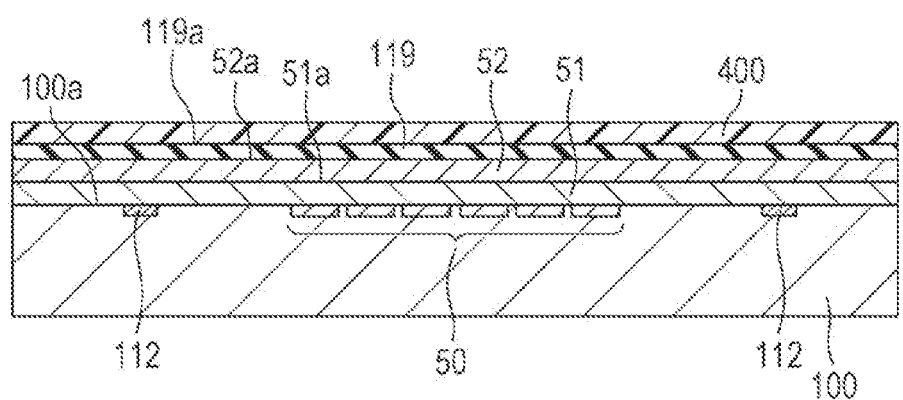
FIG. 4C is a cross section illustrating a step in the image sensor fabrication method of the present embodiment.
Figure 4D:
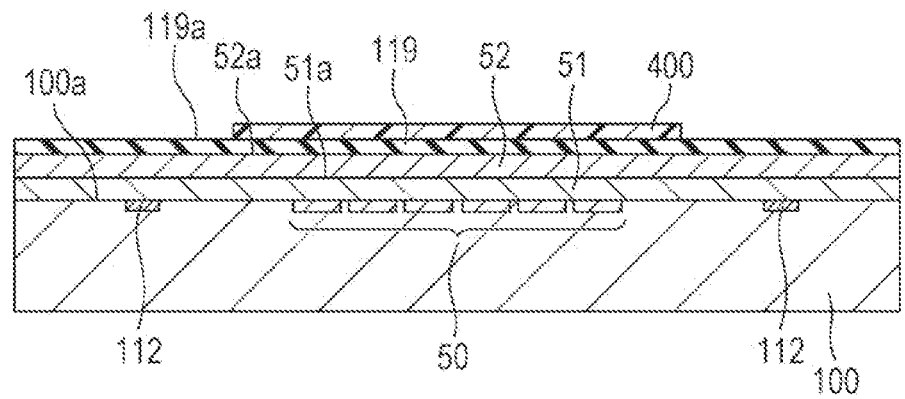
FIG. 4D is a cross section illustrating the step in the image sensor fabrication method of the present embodiment.

The photoelectric conversion film 51, the transparent electrode 52, and the insulating layer 119 are patterned by removing each of a portion of the photoelectric conversion film 51, a portion of the transparent electrode 52, and a portion of the insulating layer 119. As illustrated in FIG. 4C, a resist film 400, which is photosensitive, is formed on the insulating layer 119. The resist film 400 is formed by, for example, a spin coating method. Next, by exposing the resist film 400 using a photo mask and by performing development, as illustrated in FIG. 4D, a mask having a predetermined pattern is formed of the resist film 400.

Next, the photoelectric conversion film 51, the transparent electrode 52, and the insulating layer 119 are etched using the mask formed of the resist film 400. The photoelectric conversion film 51, the transparent electrode 52, and the insulating layer 119 may be patterned by dry etching.

For the insulating layer 119 and the transparent electrode 52, a gas containing halogens such as fluorine, chlorine, bromine, and iodine may be used or a gas containing, an element, at least either fluorine or chlorine may be used. Moreover, as dry etching, reactive ion etching (RIE) may be used, in which a gas is converted into a plasma state by plasma discharge, and chemical species of the plasma state gas react with the insulating layer 119 and the transparent electrode 52. The insulating layer 119 and the transparent electrode 52 are generally formed of a material containing nitrogen or silicon, and thus the insulating layer 119 and the transparent electrode 52 can be efficiently etched using these gases and the etching method.

In contrast, the photoelectric conversion film 51 may be dry-etched using a gas containing oxygen. More specifically, a chamber is filled with a gas containing oxygen, and the photoelectric conversion film 51 may be oxidized by chemical etching using oxidation reaction. The photoelectric conversion film 51 is rich in carbon, and thus can be removed as carbon oxides through oxidation reaction with oxygen gas.

In this manner, by etching the insulating layer 119 and transparent electrode 52 and the photoelectric conversion film 51 using different gas species, side etching can be adjusted while suppressing damage due to, for example, plasma at the time of dry etching. In addition, since the top surface 51a of the photoelectric conversion film 51 is covered by the insulating layer 119, only the side surfaces 51s are exposed to the outside during the fabrication process of the image sensor 101. Therefore, it is possible to suppress contact of the photoelectric conversion film 51 with, for example, oxygen, ozone, and moisture and deterioration of the photoelectric conversion film 51 during etching and during other fabrication steps.

Figure 4E:
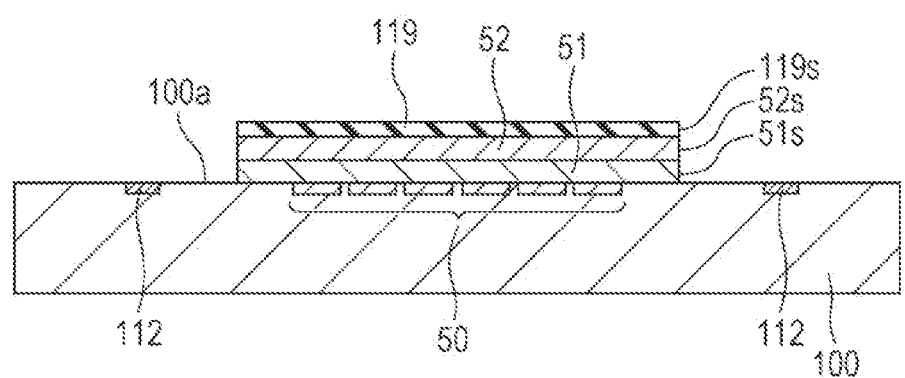
FIG. 4E is a cross section illustrating the step in the image sensor fabrication method of the present embodiment.

By performing the patterning step, as illustrated in FIG. 4E, the portion of the photoelectric conversion film 51, the portion of the transparent electrode 52, and the portion of the insulating layer 119 are each removed, and the photoelectric conversion film 51, the transparent electrode 52, and the insulating layer 119 can be formed that have a desired pattern and whose side surfaces 51s, side surfaces 52s, and side surfaces 119s are exposed. In a case where the amount of side etching is small, the side surfaces 119s of the insulating layer 119 are positioned substantially flush with the side surfaces 52s of the transparent electrode 52.

(F) Step for Forming Connection Layer

Figure 4F:
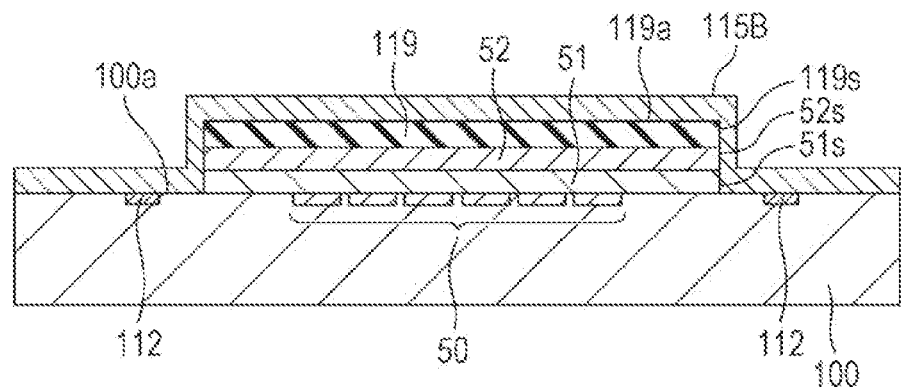
FIG. 4F is a cross section illustrating a step in the image sensor fabrication method of the present embodiment.
Figure 4G:
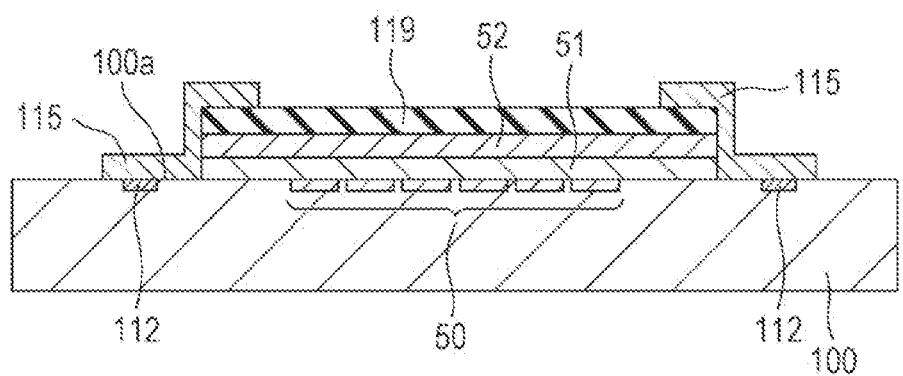
FIG. 4G is a cross section illustrating the step in the image sensor fabrication method of the present embodiment.

The connectors 115 are formed each of which connects the corresponding side surface 52s of the transparent electrode 52 to the corresponding control electrode 112. As illustrated in FIG. 4F, a layer 115B formed of a metal or a metallic compound is formed entirely on the top surface 100a of the substrate 100 so as to cover the top surface 119a of the insulating layer 119, the side surfaces 119s of the insulating layer 119, the side surfaces 52s of the transparent electrode 52, and the side surfaces 51s of the photoelectric conversion film 51. The layer 115B can be formed by, for example, sputtering or a vacuum deposition method. Thereafter, a resist film (not illustrated) is formed so as to expose at least the region under which the pixel electrodes 50 are provided. By etching the layer 115B using the resist film as a mask, as illustrated in FIG. 4G, the connectors 115 are formed that are joined to the control electrodes 112 on the top surface 100a of the substrate 100 and are joined to the side surfaces 52s of the transparent electrode 52.

(G) Step for Forming Protective Film

Figure 4H:
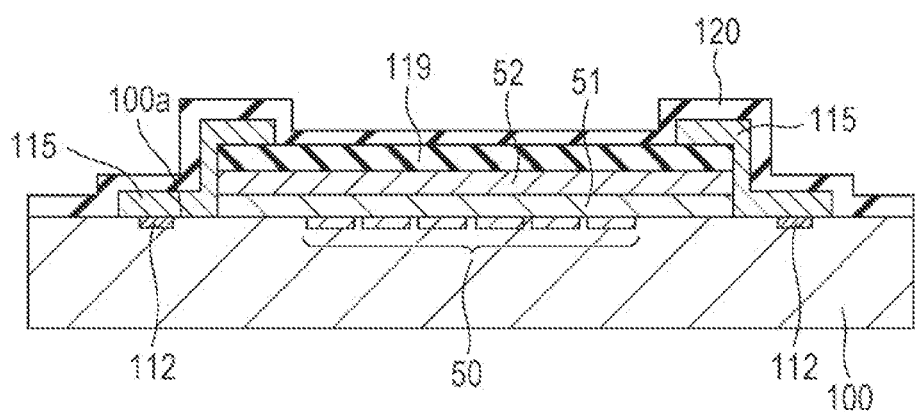
FIG. 4H is a cross section illustrating a step in the image sensor fabrication method of the present embodiment.

In a case where the image sensor 101 is provided with the protective film 120, as illustrated in FIG. 4H, the protective film is formed on the top surface 100a of the substrate 100 so as to cover the connectors 115 and the insulating layer 119. As a result, the image sensor 101 is fabricated.

Characteristics of Image Sensor

In the image sensor 101, a portion of the voltage application path from the control electrode 112 to the photoelectric conversion film 51 does not need translucency, and wiring in the portion is formed using the connectors 115, which have higher conductivity than the transparent electrode 52, instead of the transparent electrode 52. This makes it possible to apply the voltage of the control electrode 112 to the photoelectric conversion film 51 with low resistance via the transparent electrode 52, and voltage fluctuation at the photoelectric conversion film 51 is suppressed. Thus, an image sensor that enables more stable imaging is realized. In addition, such an image sensor is used in imaging devices of mobile devices for which lower power consumption is desired, and imaging devices can be realized that enable a high-speed electronic shutter or higher-speed spectral sensitivity characteristic switching.

Moreover, by using the above-described fabrication process, the photoelectric conversion film 51 is covered by the insulating layer, and it is possible to suppress damage to the photoelectric conversion film 51 during the fabrication process of the image sensor. Since the transparent electrode 52 is in contact with the connectors 115 at the side surfaces 52s of the transparent electrode 52, the side surfaces 52s for connection to the connectors 115 are formed by patterning the transparent electrode 52. Unlike the image sensors disclosed in Japanese Unexamined Patent Application Publication No. 2014-60315 and U.S. Pat. No. 9,224,789, an additional opening for establishing contact does not need to be formed in the insulating layer 119. This makes it possible to reduce the number of masks and the number of fabrication steps in the fabrication process of the image sensor 101, thereby reducing the fabrication cost and fabrication time of the image sensor 101. Therefore, according to the present embodiment, it is possible to fabricate the image sensor 101, which is a high-performance image sensor, at low cost.

Other Embodiment

Various modifications can be made to the image sensor 101 of the present embodiment.

Figure 5:
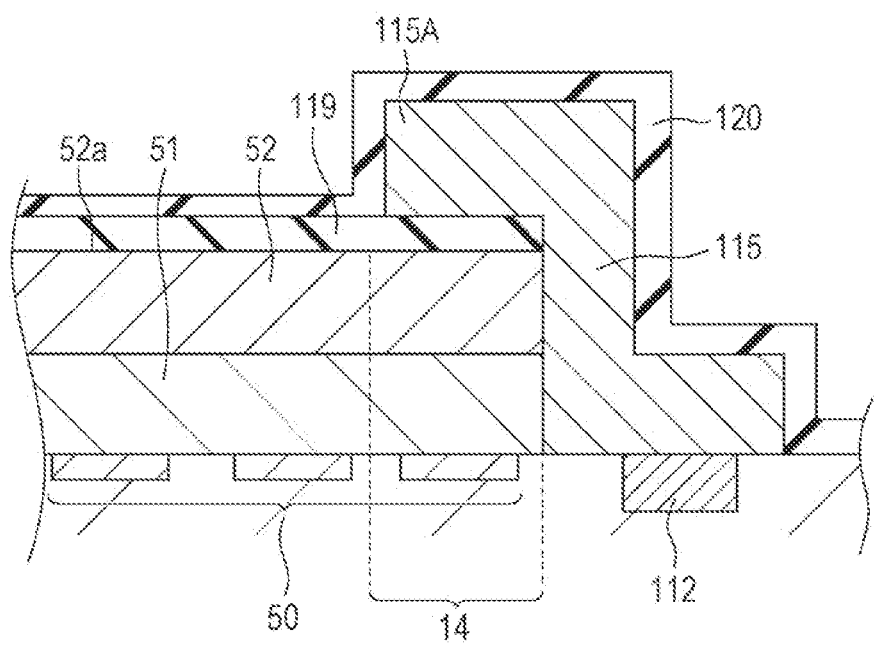
FIG. 5 is a schematic cross section illustrating a portion of another form of the image sensor.

Various modifications can be made to the arrangement and shape of the connectors 115. As illustrated in FIG. 5, in plan view, a portion 115A of a connector 115 that covers the top surface 119a of the insulating layer 119 may overlie at least some of the plurality of pixel electrodes 50. The connector 115 serves as a light shielding film, and at all times light does not enter the unit pixel cells 14 of the pixel electrodes 50 that the portion 115A of the connector 115 overlies. Thus, the unit pixel cells 14 can be used to obtain Optical Black, which is a reference signal for the dark state.

Figure 6:
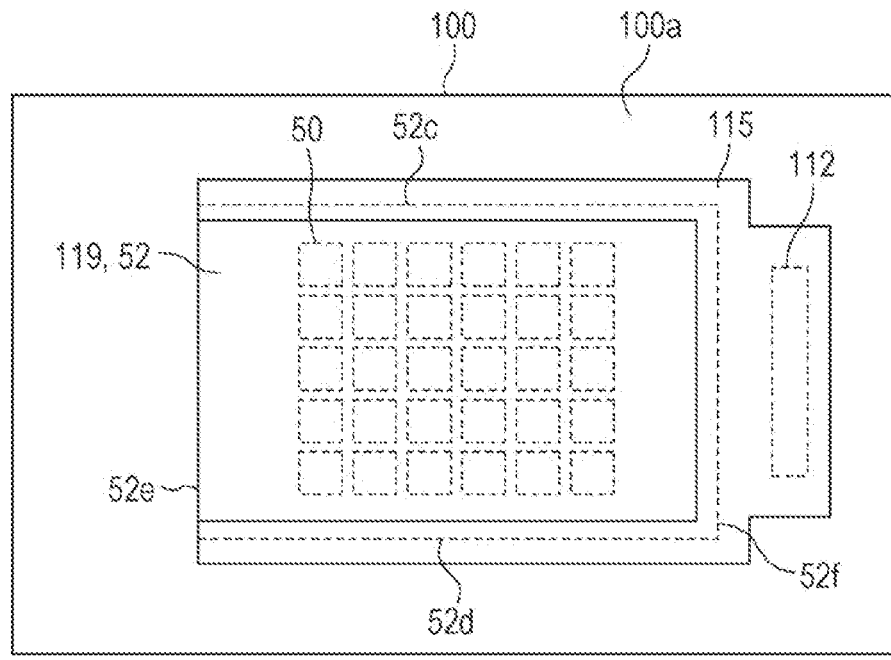
FIG. 6 is a schematic top view of the other form of the image sensor with its protective film removed.

As illustrated in FIG. 6, a connector 115 may be arranged on three sides of the rectangular shape of the transparent electrode 52. In this case, the connector 115 is joined to the three side surfaces 52s of the sides 52c, 52d, and 52f. In this embodiment, one control electrode 112 is arranged in the top surface 100a of the substrate 100. According to this embodiment, although the control electrode 112 is arranged at only one position, the connector 115 with low resistance is connected to the three sides of the transparent electrode 52. The area of the junction of the connector 115 and the transparent electrode 52 is increased, and thus the connector 115 and the transparent electrode 52 can be electrically connected to each other with lower resistance. Therefore, a delay occurring when a voltage is applied to the transparent electrode 52 is suppressed, and the isochronous level of voltage changes increases.

Figure 7:
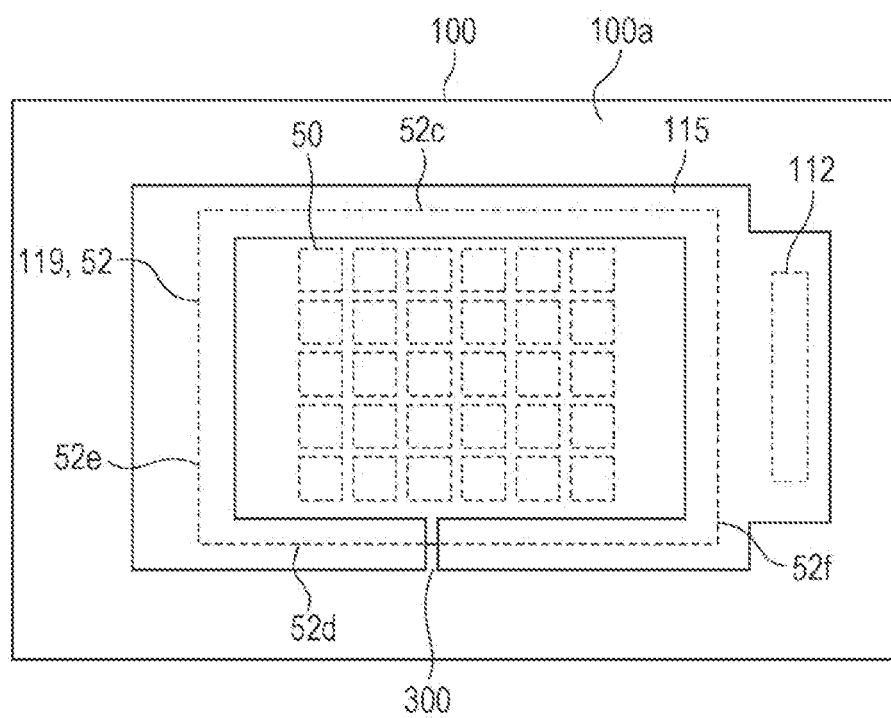
FIG. 7 is a schematic top view of another form of the image sensor with its protective film removed.
Figure 8:
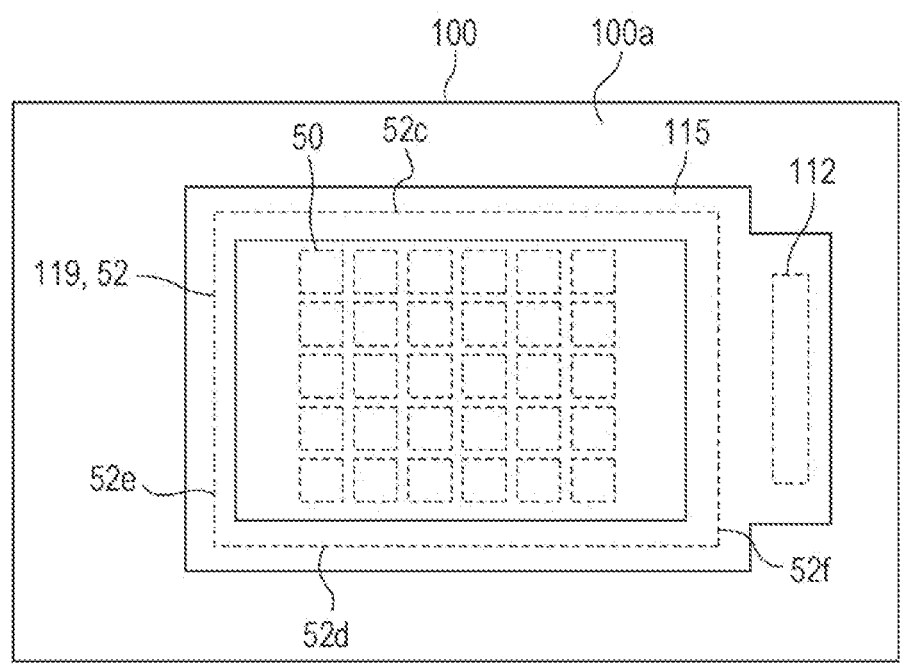
FIG. 8 is a schematic top view of another form of the image sensor with its protective film removed.

As illustrated in FIGS. 7 and 8, a connector 115 may be arranged on the four sides of the rectangular shape of the transparent electrode 52. In this case, the connector 115 is joined to the four side surfaces 52s of the sides 52c, 52d, 52e, and 52f. In this case, the connector 115 may be provided with a gap 300 as illustrated in FIG. 7 or does not have to be provided with the gap 300 as illustrated in FIG. 8. In a case where the gap 300 is provided as illustrated in FIG. 7, for example, when the connector 115 is formed using a shadow mask, the gap 300 can be used to hold a mask for the opening of a light irradiation region. In a case where the connector 115 is continuously connected to the side surfaces 52s of the four sides of the rectangular shape as illustrated in FIG. 8, a delay occurring when a voltage is applied to the transparent electrode 52 is more greatly suppressed, and the isochronous level of voltage changes increases. Moreover, since the connector 115 covers all the side surfaces of the transparent electrode 52 and the photoelectric conversion film 51, the connector 115 also serves to prevent the photoelectric conversion film 51 from peeling off the substrate and serves to prevent the side surfaces of the photoelectric conversion film 51 from being exposed to the atmosphere or the like.

Figure 9A:
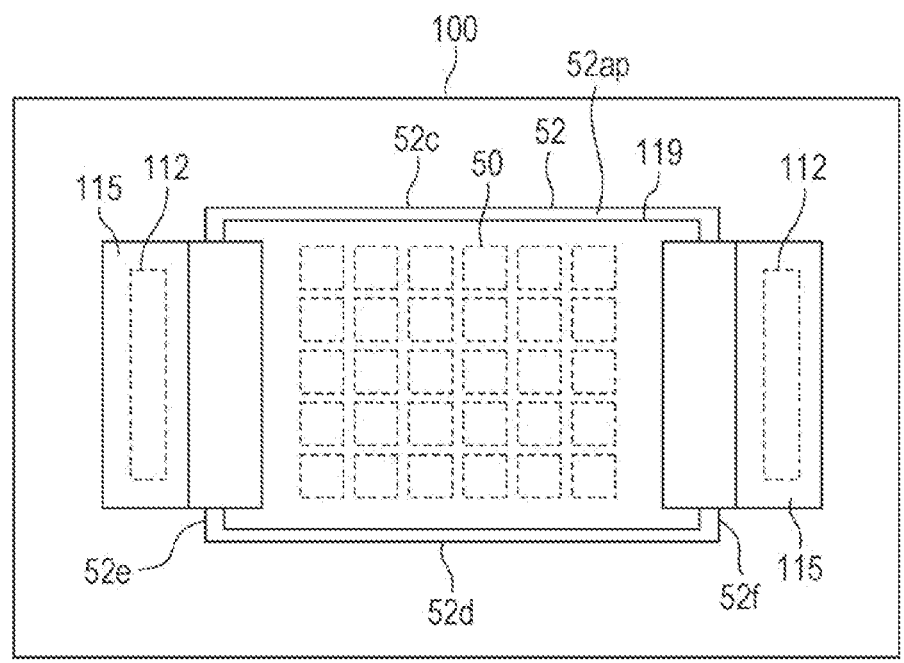
FIG. 9A is a top view of another form of the image sensor.
Figure 9B:
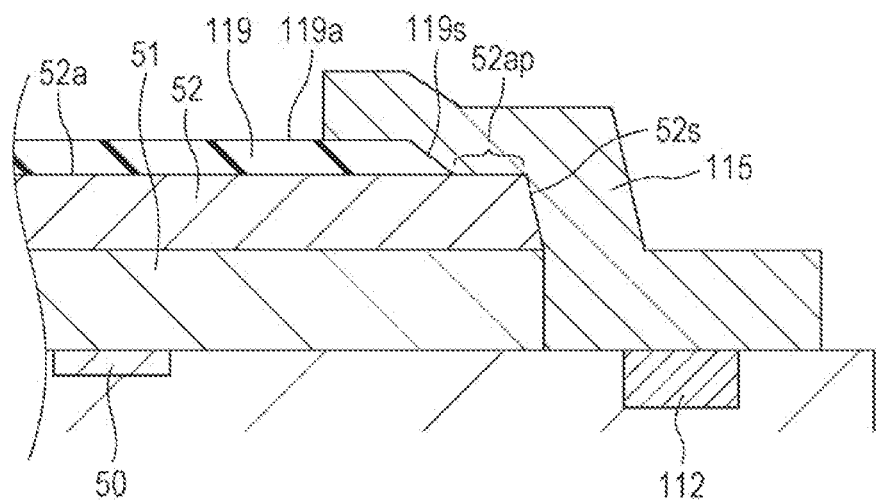
FIG. 9B is a schematic cross section illustrating a portion of the other form of the image sensor of FIG. 9A.
Figure 10:
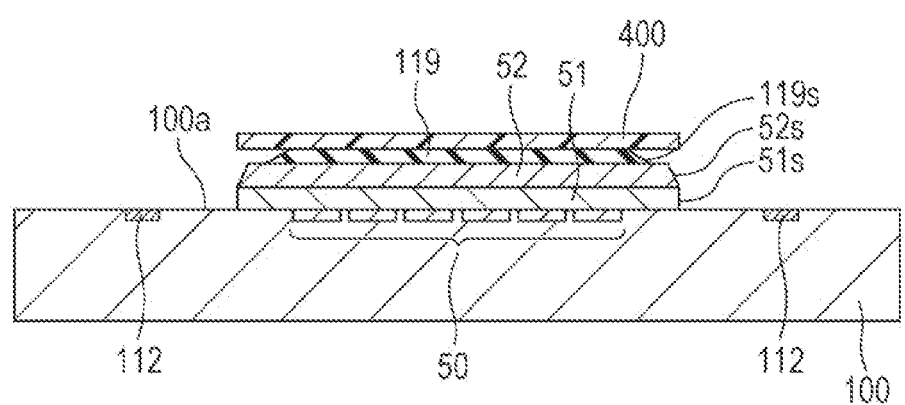
FIG. 10 is a cross section illustrating a step in another form of the image sensor fabrication method.

As illustrated in FIGS. 9A and 9B, a portion of the top surface 52a of the transparent electrode 52 does not have to be covered by the insulating layer 119. Specifically, an outer peripheral portion 52ap of the top surface 52a is not covered by the insulating layer 119 and exposed from the insulating layer 119. Such a structure can be formed by, for example, etching the insulating layer 119 also in the direction perpendicular to the thickness direction when, as illustrated in FIG. 10, the insulating layer 119, the transparent electrode 52, and the photoelectric conversion film 51 are formed by etching using the resist film 400 in the patterning step (E). During the patterning step (E), the insulating layer 119 is exposed to the etching environment for the longest period of time, and thus the insulating layer 119 is most greatly etched in the direction perpendicular to the thickness direction, so that the side surfaces 119s are recessed and the outer peripheral portion 52ap of the transparent electrode 52 is exposed. In this case, at each of the four sides 52c, 52d, 52e, and 52f of the transparent electrode 52, the side surface 119s of the insulating layer 119 is positioned closer to the center of the transparent electrode 52 than the side surface 52s of the transparent electrode 52 is. In the cross section illustrated in FIG. 9B, the ends of the insulating layer 119 are positioned toward the inside of the transparent electrode 52 relative to the ends of the transparent electrode 52.

The outer peripheral portion 52ap of the top surface 52a of the transparent electrode 52, which is not covered by the insulating layer 119, may be covered by and joined to connectors 115. In this case, the connectors may further cover the protective film 120. Although the connectors cover the outer peripheral portion 52ap of the transparent electrode 52 but the protective film 120 does not have to cover the outer peripheral portion 52ap. By joining the outer peripheral portion 52ap to the connectors 115, the contact area of the transparent electrode 52 and the connectors 115 can be further increased, and the transparent electrode 52 can be electrically connected to the connectors 115 with lower resistance.

What is claimed is:

1. An image sensor comprising:
pixel electrodes arranged side by side in a first direction;
a first electrode;
a photoelectric conversion film located on the pixel electrodes;
a second electrode located on the photoelectric conversion film;
an insulating layer located on at least a portion of a top surface of the second electrode; and
a connection layer that electrically connects the first electrode to the second electrode and that has a light-blocking property, wherein:
the connection layer is in contact with at least one side surface of the second electrode, and
a width of the connection layer along the first direction is larger than a width of each of the pixel electrodes along the first direction.

2. The image sensor according to claim 1, wherein the connection layer is further in contact with a side surface of the photoelectric conversion film.

3. The image sensor according to claim 1, wherein the connection layer covers a portion of the insulating layer.

4. The image sensor according to claim 1, wherein, in a plan view, the connection layer partially overlaps with the pixel electrodes.

5. The image sensor according to claim 1, further comprising: a protective film that covers the connection layer and the insulating layer.

6. The image sensor according to claim 1, wherein:
in a plan view, the second electrode has a polygonal shape,
the at least one side surface of the second electrode includes a plurality of side surfaces, and
the connection layer is in contact with the plurality of side surfaces of the second electrode, and overlaps the plurality of side surfaces in the plan view.

7. The image sensor according to claim 6, wherein the connection layer entirely covers the at least one side surface of the second electrode.

8. The image sensor according to claim 1, wherein, in a plan view, the connection layer overlaps with at least a portion of the insulating layer, at least a portion of the second electrode, and at least a portion of the photoelectric conversion film.

9. The image sensor according to claim 1, wherein a side surface of the insulating layer, the at least one side surface of the second electrode, and a side surface of the photoelectric conversion film are aligned with each other.

10. The image sensor according to claim 1, wherein the pixel electrode is in direct contact with the photoelectric conversion film.

11. The image sensor according to claim 1, wherein the photoelectric conversion film is continuously provided over the plurality of pixels.

12. The image sensor according to claim 1, wherein:
the connection layer includes a first part and a second part separately provided from the first part, and the first part is in contact with one side surface of the second electrode and the second part is in contact with another side surface of the second electrode.

* * * * *